(12) United States Patent
Itami et al.

(10) Patent No.: US 10,930,805 B2
(45) Date of Patent: Feb. 23, 2021

(54) PHOTOELECTRIC CONVERSION MODULE

(71) Applicant: Solar Frontier K.K., Tokyo (JP)

(72) Inventors: Takehiro Itami, Tokyo (JP); Yoshiya Nishijima, Tokyo (JP)

(73) Assignee: Solar Frontier K.K., Tokyo (JP)

( * ) Notice: Subject to any disclaimer, the term of this patent is extended or adjusted under 35 U.S.C. 154(b) by 37 days.

(21) Appl. No.: 16/468,048

(22) PCT Filed: Nov. 20, 2017

(86) PCT No.: PCT/JP2017/041689
§ 371 (c)(1),
(2) Date: Jun. 10, 2019

(87) PCT Pub. No.: WO2018/110213
PCT Pub. Date: Jun. 21, 2018

(65) Prior Publication Data
US 2020/0020818 A1 Jan. 16, 2020

(30) Foreign Application Priority Data
Dec. 16, 2016 (JP) .............................. JP2016-244739

(51) Int. Cl.
*H01L 31/0236* (2006.01)
*H01L 31/046* (2014.01)
(Continued)

(52) U.S. Cl.
CPC ...... *H01L 31/02366* (2013.01); *H01L 31/046* (2014.12); *H01L 31/049* (2014.12); *H01L 31/0481* (2013.01)

(58) Field of Classification Search
None
See application file for complete search history.

(56) References Cited

U.S. PATENT DOCUMENTS

2017/0005215 A1 1/2017 Wang et al.
2017/0278993 A1 9/2017 Tashima et al.

FOREIGN PATENT DOCUMENTS

JP H07-135335 5/1995
JP 2011-253836 12/2011
(Continued)

OTHER PUBLICATIONS

Tashima machine translation (Year: 2016).*
International Search Report for PCT/JP2017/041689 dated Jan. 30, 2018.

*Primary Examiner* — Shannon M Gardner
(74) *Attorney, Agent, or Firm* — IPUSA, PLLC

(57) ABSTRACT

A photoelectric conversion module includes a photoelectric conversion panel, and a frame attached to an outer edge of the photoelectric conversion panel. The photoelectric conversion panel includes a first substrate, a photoelectric conversion layer disposed on the first substrate, a second substrate that covers the photoelectric conversion layer, and a seal that is disposed over peripheral portions of the first substrate and the second substrate so as to seal the first substrate and the second substrate, and that also covers a portion of the photoelectric conversion layer. An insulating material made of a different material from the seal is provided between the seal and the frame.

8 Claims, 4 Drawing Sheets

(51) Int. Cl.
*H01L 31/049* (2014.01)
*H01L 31/048* (2014.01)

(56) References Cited

FOREIGN PATENT DOCUMENTS

| | | |
|---|---|---|
| JP | 2014-135377 | 7/2014 |
| JP | 2016-063125 | 4/2016 |
| JP | 2016-225507 | 12/2016 |
| WO | 2008/150558 | 12/2008 |
| WO | 2015/096492 | 7/2015 |
| WO | 2016/043137 | 3/2016 |

* cited by examiner

PHOTOELECTRIC CONVERSION MODULE

TECHNICAL FIELD

The present invention relates to a photoelectric conversion module.

BACKGROUND ART

A photoelectric conversion panel includes a photoelectric conversion device including a first substrate made of glass or the like, a lower electrode layer, a semiconductor layer, and an upper electrode layer. The photoelectric conversion panel further includes a sealing material that covers the photoelectric conversion device, and a translucent second substrate disposed on the sealing material. The photoelectric conversion panel may have a structure in which a seal made of butyl rubber or the like covers the outer surface of the sealing material and also seals wiring conductors disposed on the outer periphery of the photoelectric conversion panel (see Patent Document 1, for example).

By employing a structure having the seal, entry of moisture into the photoelectric conversion device is prevented, and the moisture resistance reliability of the photoelectric conversion panel is thus improved.

A photoelectric conversion module is formed by using a butyl-based adhesive or a silicone-based adhesive to attach the photoelectric conversion panel to a frame made of metal such as aluminum.

RELATED-ART DOCUMENTS

Patent Documents

[PATENT DOCUMENT 1] Japanese Laid-open Patent Publication No. 2014-135377

SUMMARY OF THE INVENTION

Problem to be Solved by the Invention

However, in the above-described photoelectric conversion panel with improved moisture resistance reliability, an insufficient amount of an adhesive to ensure insulation between the photoelectric conversion panel and the metal frame is often applied when the photoelectric conversion panel is attached to the metal frame. As a result, the seal that is in contact with a conductive member (such as the above-described wiring conductors) may also contact the metal frame. Thus, sufficient insulation sometimes fails to be maintained in the photoelectric conversion module.

The insulation performance of the photoelectric conversion module can be improved by increasing the distance between the photoelectric conversion device and the frame and also increasing the width of the seal that covers the outer surface of the sealing material. However, if the size of the substrates is increased to increase the distance between the photoelectric conversion device and the frame, costs increase, and if the size of the photoelectric conversion device is reduced, the amount of electric power generation decreases. Thus, the above approach is not preferable.

It is an object of the present invention to improve moisture resistance reliability and also insulation performance of a photoelectric conversion module.

Means to Solve the Problem

A photoelectric conversion module includes a photoelectric conversion panel, and a frame attached to an outer edge of the photoelectric conversion panel. The photoelectric conversion panel includes a first substrate, a photoelectric conversion layer disposed on the first substrate, a second substrate that covers the photoelectric conversion layer, and a seal that is disposed over peripheral portions of the first substrate and the second substrate so as to seal the first substrate and the second substrate, and that also covers a portion of the photoelectric conversion layer. An insulating material made of a different material from the seal is provided between the seal and the frame.

Effects of the Invention

According to disclosed technology, it is possible to improve moisture resistance reliability and also insulation performance of a photoelectric conversion module.

MODE FOR CARRYING OUT THE INVENTION

Figure 1:
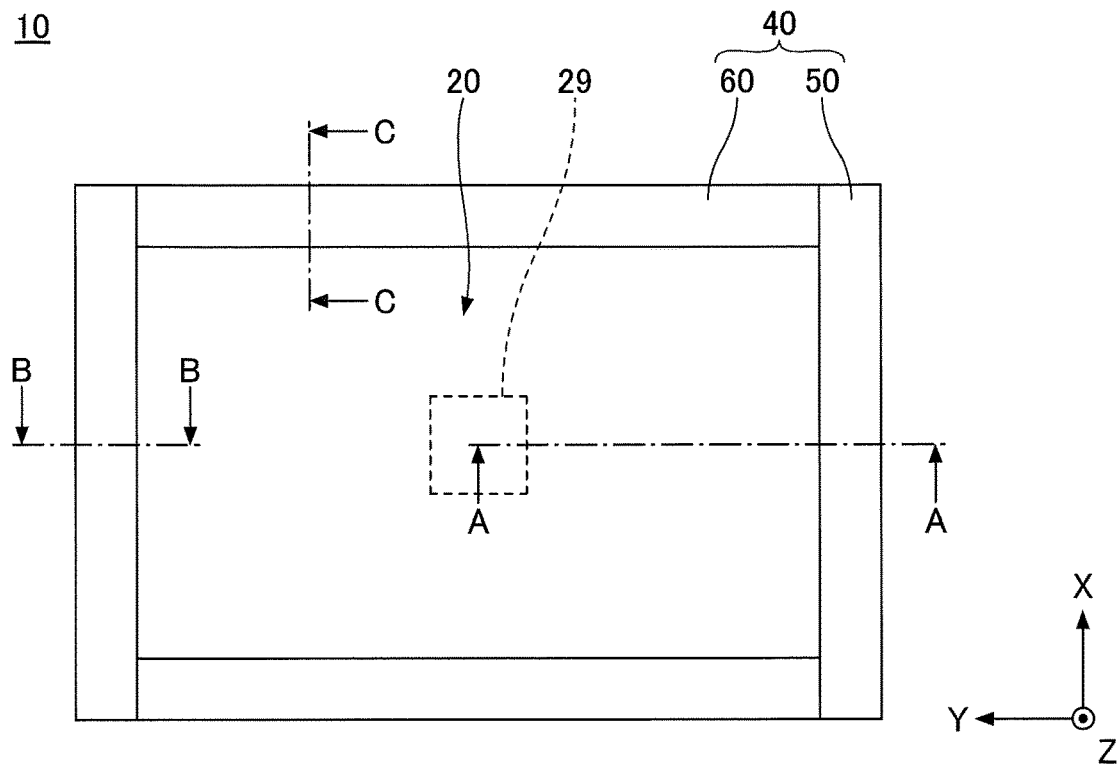
FIG. 1 is a plan view illustrating a photoelectric conversion module according to a first embodiment.

In the following, embodiments of the present invention will be described with reference to the accompanying drawings. In the drawings, the same elements are denoted by the same reference numerals and a duplicate description thereof may be omitted.

First Embodiment

Figure 2:
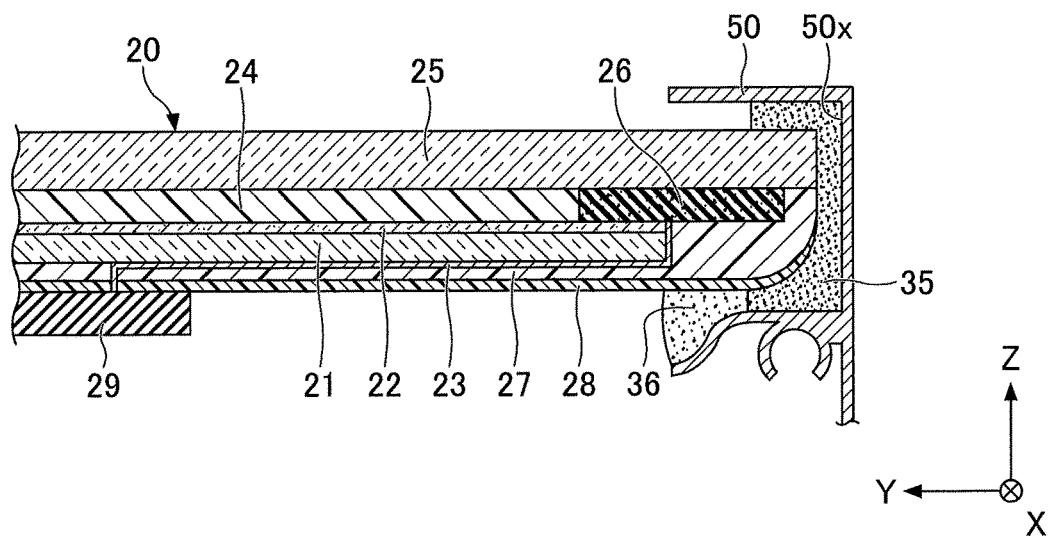
FIG. 2 is a partially enlarged cross-sectional view (part 1) of the photoelectric conversion module according to the first embodiment.
Figure 3:
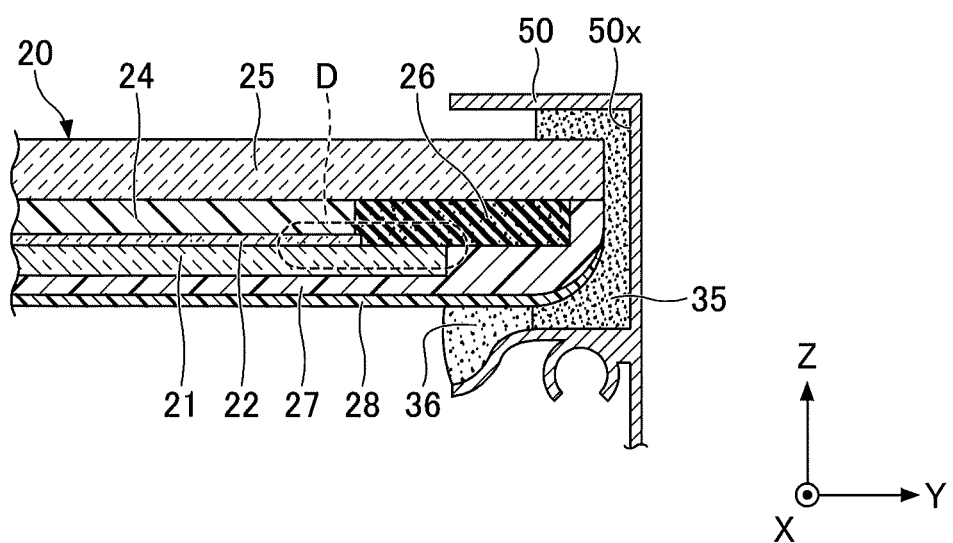
FIG. 3 is a partially enlarged cross-sectional view (part 2) of the photoelectric conversion module according to the first embodiment.
Figure 4:
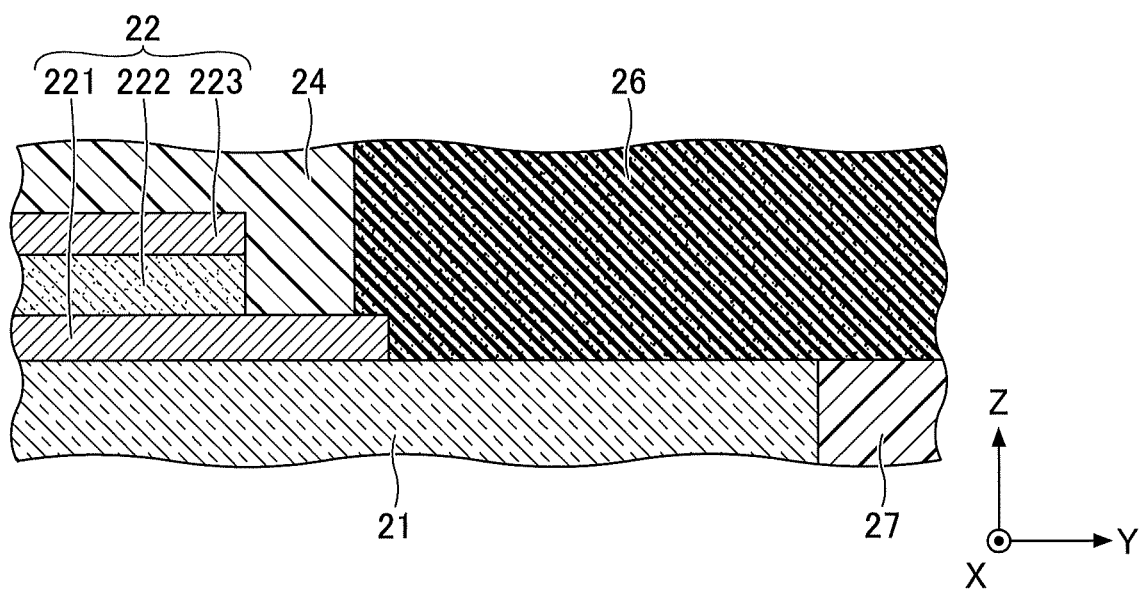
FIG. 4 is a partially enlarged cross-sectional view of a portion D of FIG. 3.
Figure 5:
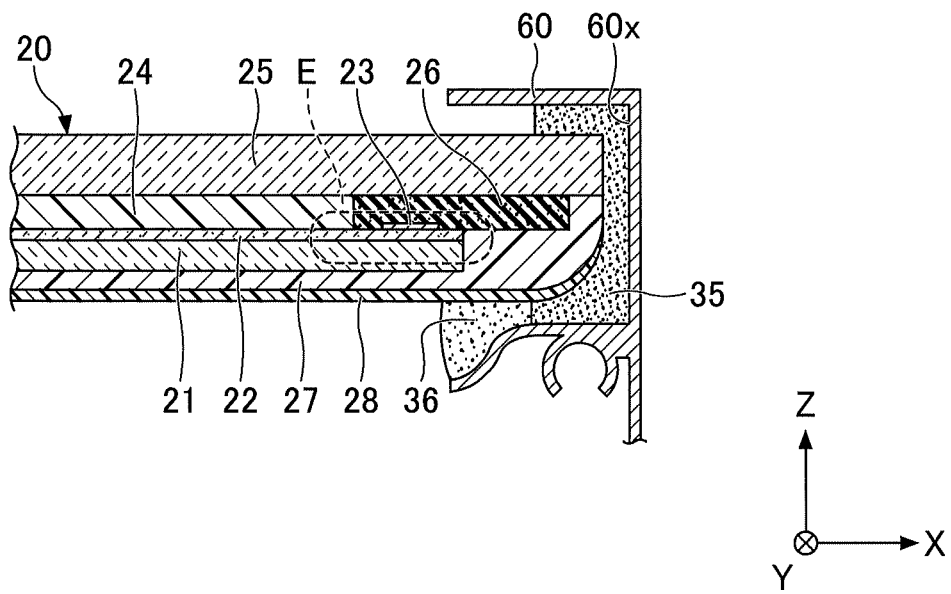
FIG. 5 is a partially enlarged cross-sectional view (part 3) of the photoelectric conversion module according to the first embodiment.
Figure 6:
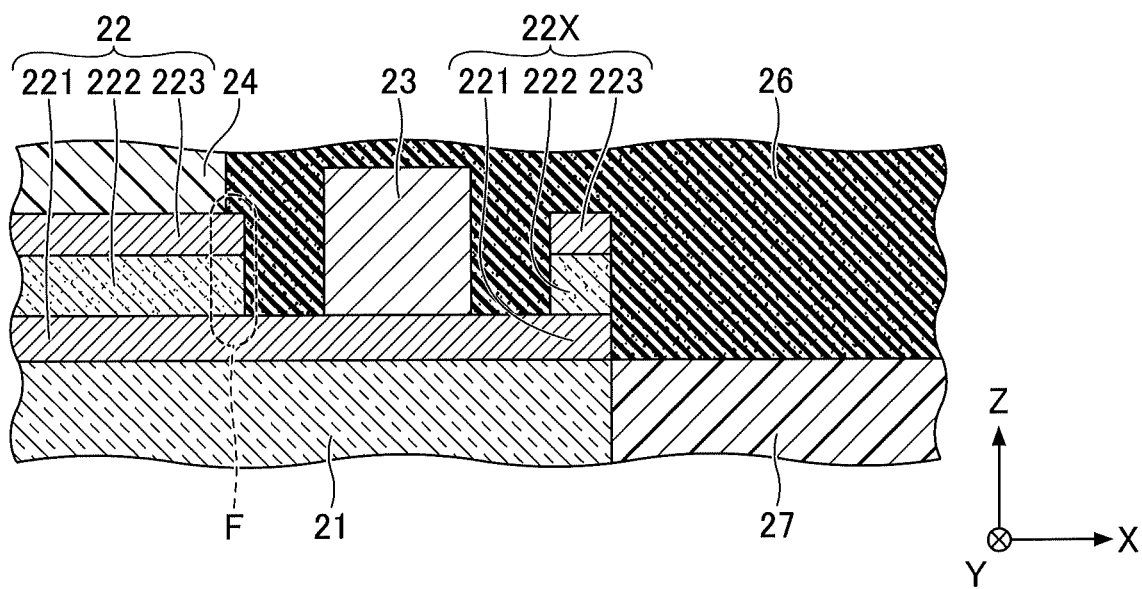
FIG. 6 is a partially enlarged cross-sectional view of a portion E of FIG. 5.

FIG. 1 is a plan view illustrating a photoelectric conversion module according to a first embodiment. FIG. 2 is a partially enlarged cross-sectional view of the photoelectric conversion module according to the first embodiment, in which a cross section taken through A-A of FIG. 1 is illustrated. FIG. 3 is a partially enlarged cross-sectional view of the photoelectric conversion module according to the first embodiment, in which a cross section taken through B-B of FIG. 1 is illustrated. FIG. 4 is a partially enlarged cross-sectional view of a portion D of FIG. 3. FIG. 5 is a partially enlarged cross-sectional view of the photoelectric conversion module according to the first embodiment, in which a cross section taken through C-C of FIG. 1 is illustrated. FIG. 6 is a partially enlarged cross-sectional view of a portion E of FIG. 5.

As illustrated in FIG. 1 through FIG. 6, a photoelectric conversion module 10 includes a photoelectric conversion panel 20 and a frame 40.

The photoelectric conversion panel 20 includes a first substrate 21, a photoelectric conversion layer 22, wiring 23, an upper seal 24, a second substrate 25, a seal 26, a lower seal 27, and a back sheet 28.

The frame 40 is a frame that is made of metal and attached to the outer edge of the photoelectric conversion panel 20. The frame 40 is a member for improving the strength of the photoelectric conversion module 10 and covering the light receiving surface, the side surfaces, and the bottom surface of peripheral portions of the photoelectric conversion panel 20 to protect the peripheral portions of the photoelectric conversion panel 20.

The frame 40 includes a pair of two short-side frames 50 and a pair of two long-side frames 60 and surrounds the photoelectric conversion panel 20. The pair of the short-side frames 50 and the pair of the long-side frames 60 are connected to each other so as to form the frame 40. For example, the pair of short-side frames 50 and the pair of long-side frames 60 are connected to each other at right angles. The short-side frames 50 and the long-side frames 60 may be formed of aluminum, for example.

The photoelectric conversion panel 20 is fitted in fitting groves 50x of the short-side frames 50 and in fitting groves 60x of the long-side frames 60 with an adhesive 35. Further, the back sheet 28 of the photoelectric conversion panel 20 adheres to the short side frames 50 and the long side frames 60 with an adhesive 36. The adhesive 36 is applied to reach the tip of a lower flange of each of the short-side frames 50. With the above configuration, the insulation between the photoelectric conversion panel 20 and short-sides frame 50 improves. For example, the adhesive 35 may be a butyl-based adhesive or a silicone-based adhesive. For example, the adhesive 36 may be a silicone-based adhesive.

In the photoelectric conversion panel 20, the first substrate 21 serves as a base on which the photoelectric conversion layer 22 is formed. For example, the first substrate 21 may be formed of white tempered glass, high strain point glass, soda lime glass, metal, or a resin. The thickness of the first substrate 21 may be, for example, approximately 1 to 3 mm.

The photoelectric conversion layer 22 is formed on the first substrate 21. The photoelectric conversion layer 22 may be, for example, a copper indium selenide (CIS) based layer, a copper zinc tin sulfide (CZTS) based layer, or an amorphous-silicon-based layer. In the present embodiment, the CIS-based layer is used as an example. For example, the photoelectric conversion layer 22 may have a structure in which a bottom electrode 221, a light absorbing layer 222, and a transparent electrode 223 are stacked in this order from the first substrate 21 side (see FIG. 4 and FIG. 6).

The bottom electrode 221 may be formed of molybdenum (Mo), or may be formed of metal including molybdenum (Mo), for example. The light absorbing layer 222 may be a p-type semiconductor layer. Electric power generated by photoelectric conversion in the light absorbing layer 222 is output through the wiring 23 and a terminal box 29 as electric current.

For example, the light absorbing layer 222 may be formed of a compound consisting of copper (Cu), indium (In), and selenium (Se), or a compound consisting of copper (Cu), indium (In), gallium (Ga), selenium (Se), and sulfur (S). Examples of the compound include $CuInSe_2$, $Cu(InGa)Se_2$, and $Cu(InGa)(SSe)_2$.

The transparent electrode 223 may be a transparent n-type semiconductor layer, for example. For example, as the transparent electrode 223, a zinc oxide (ZnO) based thin film or an ITO thin film may be used.

The upper seal 24 is disposed on the photoelectric conversion layer 22 under which the first substrate 21 is disposed, and seals the light receiving surface side of the photoelectric conversion layer 22, and is disposed above the surface of the first substrate 21 on which the photoelectric conversion layer 22 is formed. The second substrate 25 is disposed on the upper seal 24 to cover the photoelectric conversion layer 22.

As the upper seal 24, a translucent material such as ethylene-vinyl acetate (EVA) resin and polyvinyl butyral (PVB) resin may be used. The thickness of the upper seal 24 may be approximately 0.2 to 1.0 mm. As the second substrate 25, a white tempered glass plate having a thickness of approximately 0.5 to 4.0 mm may be used, for example.

The seal 26 is disposed over peripheral portions of the first substrate 21 and the second substrate 25 to seal the first substrate 21 and the second substrate 25. Further, the seal 26 adheres to the surfaces of the first substrate 21 and the second substrate 25 facing each other. At the A-A cross section side (a wiring area) of corresponding one of the short-side frames 50, a portion of the photoelectric conversion layer 22 is covered by the seal 26.

For example, as the seal 26, hot-melt-butyl-based rubber, molded butyl rubber, or silicone-based resin may be used. In terms of moisture resistance, it is preferable to use butyl rubber rather than silicone-based resin. By providing the seal 26, it is possible to prevent entry of moisture into the photoelectric conversion layer 22, thus improving the moisture resistance reliability of the photoelectric conversion module 10.

The lower seal 27, which serves as an insulating material, is disposed at the bottom side of the first substrate 21. The lower seal 27 covers the bottom surface and the side surfaces of the first substrate 21, extends from the bottom surface of the first substrate 21 to the seal 26 side, and also covers the bottom surface and the side surfaces of the seal 26. Namely, the lower seal 27 is also provided between the seal 26 and the frame 40 (between the seal 26 and the short side frames 50 and between the seal 26 and the long side frames 60).

The lower seal 27 is formed of a different material from the seal 26. As a material of the lower seal 27, ethylene-vinyl acetate resin may be used, for example. The thickness of portions of the lower seal 27 that cover the side surfaces of the seal 26 may be, for example, approximately 0.2 to 1.0 mm.

As described above, in the present embodiment, the lower seal 27, which serves as a sealing material that covers the bottom surface side of the first substrate 21, extends to the seal 26 side, and is also provided between the seal 26 and the frame 40. It should be noted that the insulating material provided between the seal 26 and the frame 40 is not required to be integrally formed with the lower seal 27 as one piece. In this case, an insulating material that is different from the lower seal 27 may be provided between the seal 26 and the frame 40.

The bottom surface side of the lower seal (opposite to the first substrate 21) is covered by the back sheet 28. The back sheet 28 may have a structure in which polyethylene terephthalate (PET) resin and transparent PET resin are stacked. The back sheet 28 may further include an aluminum layer, a black PET layer, or the like.

As illustrated in FIG. 3 and FIG. 4, a non-wiring area (an area in which the wiring 23 is not provided) is provided at the B-B cross section side of corresponding one of the short-side frames 50.

In the non-wiring area, the photoelectric conversion layer 22 is removed by several millimeters (for example, approximately 5 mm) in width from the end portion of the first substrate 21 through a deletion process, and a part of the surface of the first substrate 21 is exposed. Further, the layers of the photoelectric conversion layer 22 other than the bottom electrode 221 are each removed by a few millimeters (for example, approximately 1 mm) in width from the exposed part of the surface of the first substrate 21, and a part of the surface of the bottom electrode 221 is exposed.

At the B-B cross section side (the non-wiring area) of corresponding one of the short-side frames 50, the seal 26 is disposed to at least cover the exposed part of the first substrate 21. However, the seal 26 may cover the exposed part of the surface of the bottom electrode 221. Further, the seal 26 may also cover the peripheral portion of the photoelectric conversion layer 22.

As illustrated in FIG. 5 and FIG. 6, a wiring area (an area in which the wiring 23 is provided) is provided at the C-C cross-section side of one of the long-side frames 60. The long-side frame 60 (on the side opposite to the C-C cross-section side) may also have the same structure.

In each of the wiring areas of the long-side frames 60, a photoelectric conversion layer 22X (with a width of approximately 1 mm, for example), separated from the photoelectric conversion layer 22, remains at the end portion of the first substrate 21. Further, the layers of the photoelectric conversion layer 22 other than the bottom electrode 221 are each removed by several millimeters (approximately 5 mm, for example) in width from the inner edge of the photoelectric conversion layer 22X, and the surface of the bottom electrode 221 is exposed. The wiring 23 is formed on the exposed surface of the bottom electrode 221.

A non-electric-power-generation area F is provided at the outer edge portion of the photoelectric conversion layer 22. A non-electric-power-generation area F has the same layer configuration as the photoelectric conversion layer 22, but serves as a non-electric-power-generation cell that does not contribute to power generation. The non-electric-power-generation area F has a function to reduce stress applied to the end portion of the photoelectric conversion layer 22 (the vicinity of an interface between the upper seal 24 and the seal 26). The inner edge of the seal 26 (the interface between the upper seal 24 and the seal 26) is located on the non-electric-power-generation area F.

For example, if the interface between the upper seal 24 and the seal 26 is located on the wiring 23, the thickness of the upper seal 24 would change (a difference in level would occur) in the vicinity of the interface between the upper seal 24 and the seal 26.

In the above situation, if a temperature gradient is applied to the upper seal 24, the degree of contraction may differ depending on the location, resulting in stress being applied to an interface between the light absorbing layer 222 and the transparent electrode 223. This would cause the transparent electrode 223 to separate from the light absorbing layer 222.

Conversely, by causing the interface between the upper seal 24 and the seal 26 to be located on the non-electric-power-generation area F, the thickness of the upper seal 24 in the vicinity of the interface between the upper seal 24 and the seal 26 becomes approximately constant. Accordingly, if a temperature gradient is applied to the upper seal 24, the degree of contraction becomes approximately constant, and stress is not readily generated. Thus, separation of the transparent electrode 223 from the transparent electrode 223 can be prevented.

Further, by causing the interface between the upper seal 24 and the seal 26 to be located on the non-electric-power-generation area F (by causing the seal 26 to not overlap with the photoelectric conversion layer 22), a decrease in power generation performance or local temperature increase due to current concentration can be prevented. Note that local temperature increase due to current concentration means that, in a case where the seal overlaps with a power generation cell of the photoelectric conversion layer 22, a resistance value of the overlapped part of the power generation cell increases, and the current is concentrated towards a part other than the overlapped part of the power generation cell having a lower resistance value, thereby causing a temperature to locally increase.

As described above, the photoelectric conversion module 10 includes the lower seal 27 that is provided between the seal 26 and the frame 40 (between the seal 26 and the short-side frames 50 and between the seal 26 and the long-side frames 60), and made of a different material from the seal 26. By applying the lower seal 27, which serves as the insulating material, to the side surfaces of the seal 26, it becomes possible for the lower seal 27 to integrally cover from the bottom surface of the first substrate 21 to the side surfaces of the seal 26, thereby improving the insulation and moisture resistance reliability of the photoelectric conversion module 10.

Further, because the lower seal 27 covers from the side surfaces of the seal 26 to the bottom surface of the first substrate 21, the moisture resistance reliability of the photoelectric conversion module 10 is further improved.

Variation of First Embodiment

In a variation of the first embodiment, an example in which a seal has a different shape from the seal according to the first embodiment will be described.

Figure 7:
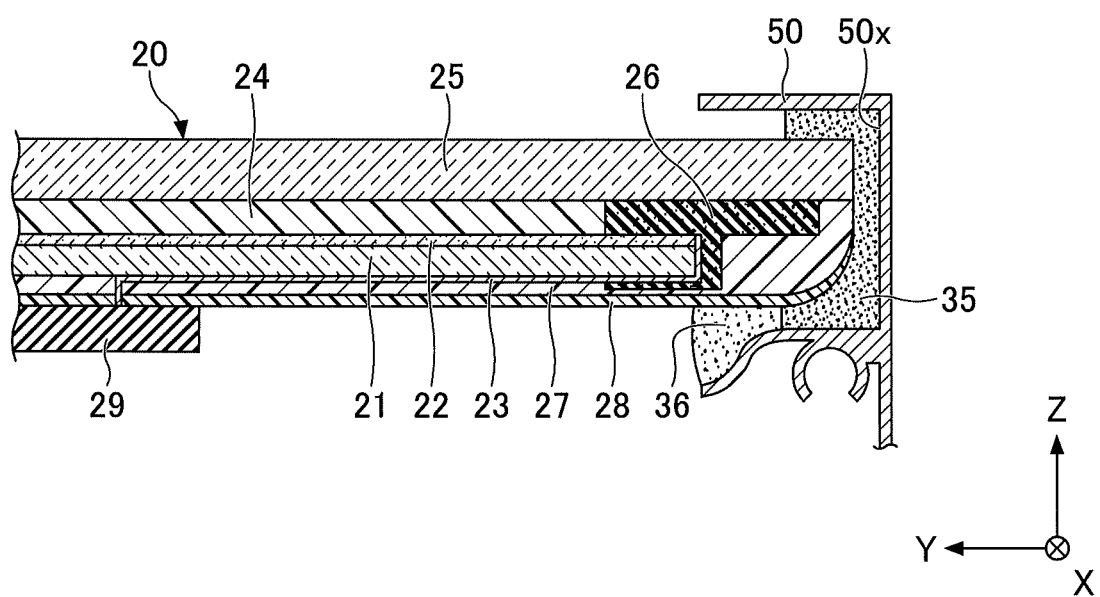
FIG. 7 is a partially enlarged cross-sectional view of a photoelectric conversion module according to a variation of the first embodiment.

FIG. 7 is a partially enlarged cross-sectional view of a photoelectric conversion module according to the variation of the first embodiment, in which a cross section taken through A-A of FIG. 1 is illustrated.

In FIG. 7, a seal 26 is disposed to extend from one surface of the first substrate 21, on which the photoelectric conversion layer 22 is disposed, to the other surface of the first substrate 21 opposite to the one surface of the first substrate 21.

As described above, by causing the seal 26 to partially cover the photoelectric conversion layer 22 and extend along the side surfaces to the bottom surface of the first substrate 21, the moisture resistance reliability of the photoelectric conversion module 10 can be further improved.

Although the present invention has been described with reference to the embodiments, the present invention is not limited to the above-described embodiments. Variations and modifications may be made to the described subject matter without departing from the scope of the invention as set forth in the accompanying claims.

For example, in the above-described embodiments, the present invention is applied to the photoelectric conversion module with a substrate structure; however, the present invention may be applied to a photoelectric conversion module with a superstrate structure.

The present application is based on and claims priority to Japanese patent application No. 2016-244739 filed on Dec. 16, 2016, with the Japanese Patent Office, the entire contents of which are hereby incorporated by reference.

DESCRIPTION OF THE REFERENCE NUMERALS

10 photoelectric conversion module
20 photoelectric conversion panel 21 first substrate
22, 22X photoelectric conversion layer
23 wiring
24 upper seal
25 second substrate
26 seal
27 lower seal
40 frame
50 short-side frame
60 long-side frame

The invention claimed is:

1. A photoelectric conversion module comprising:
a photoelectric conversion panel; and
a frame attached to an outer edge of the photoelectric conversion panel,
wherein the photoelectric conversion panel includes
a first substrate,
a photoelectric conversion layer disposed on the first substrate,
a second substrate that covers the photoelectric conversion layer,
a first seal that is disposed over peripheral portions of the first substrate and the second substrate so as to seal the first substrate and the second substrate, and that contacts a portion of the photoelectric conversion layer and a first portion of a first surface of the second substrate, and
a second seal made of a different material than the first seal and contacting a second portion of the first surface,
wherein an insulating material made of a different material from the first seal is provided between the first seal and the frame, the insulating material contacting a third portion of the first surface, and
wherein the third portion, the first portion, and the second portion are arranged in this order from an outer periphery of the photoelectric conversion panel towards a central region of the photoelectric conversion panel.

2. The photoelectric conversion module according to claim 1, wherein the photoelectric conversion panel further includes a fourth seal that covers a first surface of the first substrate opposite to a second surface of the first substrate on which the photoelectric conversion layer is disposed, and the insulating material is integrally formed with the fourth seal.

3. The photoelectric conversion module according to claim 1, wherein the first seal is formed so as to extend from a second surface of the first substrate on which the photoelectric conversion layer is disposed, to a first surface of the first substrate opposite to the second surface of the first substrate on which the photoelectric conversion layer is disposed.

4. The photoelectric conversion module according to claim 1, further comprising
a back sheet that covers a surface opposite to a first-seal-side surface of the insulating material, and
an adhesive that binds the back sheet to the frame,
wherein the adhesive is applied to reach a tip of a lower flange of the frame.

5. The photoelectric conversion module according to claim 1, wherein the first substrate includes a wiring area in which wiring is provided for outputting electric power generated in the photoelectric conversion layer, and a non-wiring area in which the wiring is not provided,
wherein, in the non-wiring area, an end portion of a second surface of the first substrate, on which the photoelectric conversion layer is disposed, is exposed from the photoelectric conversion layer, and
wherein the first seal is disposed to cover the end portion of the second surface exposed from the photoelectric conversion layer.

6. The photoelectric conversion module according to claim 5, wherein the photoelectric conversion layer has a structure in which a bottom electrode is formed on the first substrate, a light absorbing layer is formed on the bottom electrode, and a transparent electrode is formed on the light absorbing layer,
wherein, at an end portion side of the second surface of the first substrate in the non-wiring area, a surface of the bottom electrode is exposed from the light absorbing layer and the transparent electrode, and
wherein the first seal is disposed to cover the surface of the bottom electrode exposed from the light absorbing layer and the transparent electrode.

7. The photoelectric conversion module according to claim 5, wherein the first seal is disposed to cover a peripheral portion of the photoelectric conversion layer.

8. The photoelectric conversion module according to claim 1, wherein the second seal seals a light receiving surface side of the photoelectric conversion layer and is disposed above a second surface of the first substrate on which the photoelectric conversion layer is disposed,
wherein a non-electric-power-generation area is provided at an outer edge portion of the photoelectric conversion layer, and
wherein an interface between the second seal and the first seal is located on the non-electric-power-generation area.

* * * * *